United States Patent
Wang et al.

(10) Patent No.: US 10,290,574 B2
(45) Date of Patent: May 14, 2019

(54) EMBEDDED METAL-INSULATOR-METAL (MIM) DECOUPLING CAPACITOR IN MONOLITIC THREE-DIMENSIONAL (3D) INTEGRATED CIRCUIT (IC) STRUCTURE

(71) Applicant: GLOBALFOUNDRIES INC., Grand Cayman (KY)

(72) Inventors: Geng Wang, Stormville, NY (US); Kangguo Cheng, Schenectady, NY (US); Chengwen Pei, Danbury, CT (US); Juntao Li, Cohoes, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 43 days.

(21) Appl. No.: 15/408,883

(22) Filed: Jan. 18, 2017

(65) Prior Publication Data

US 2018/0204796 A1    Jul. 19, 2018

(51) Int. Cl.
| | |
|---|---|
| *H01L 23/522* | (2006.01) |
| *H01L 49/02* | (2006.01) |
| *H01L 21/822* | (2006.01) |
| *H01L 23/528* | (2006.01) |
| *H01L 21/768* | (2006.01) |

(52) U.S. Cl.
CPC .... *H01L 23/5223* (2013.01); *H01L 21/76805* (2013.01); *H01L 21/8221* (2013.01); *H01L 23/5226* (2013.01); *H01L 23/5283* (2013.01); *H01L 28/60* (2013.01)

(58) Field of Classification Search
CPC ............. H01L 21/8221; H01L 23/5223; H01L 25/0657; H01L 25/117; H01L 25/074; H01L 23/5226
See application file for complete search history.

(56) References Cited

U.S. PATENT DOCUMENTS

| | | | |
|---|---|---|---|
| 6,821,826 B1 | 11/2004 | Chan et al. | |
| 7,863,748 B2 * | 1/2011 | Oh ...................... | H01L 21/2007 257/758 |
| 8,129,256 B2 | 3/2012 | Farooq et al. | |
| 8,136,071 B2 | 3/2012 | Solomon | |
| 8,237,228 B2 * | 8/2012 | Or-Bach ........... | H01L 21/76898 257/369 |

(Continued)

FOREIGN PATENT DOCUMENTS

WO    03036672 A2    5/2003

*Primary Examiner* — Jose R Diaz
(74) *Attorney, Agent, or Firm* — Anthony Canale; Hoffman Warnick LLC (57) ABSTRACT

Various embodiments include three-dimensional (3D) integrated circuit (IC) structures and methods of forming such structures. In some cases, a 3D IC structure includes: a substrate; a first set of transistors overlying the substrate; a first inter-level dielectric (ILD) overlying the first set of transistors and the substrate; a dielectric overlying the first ILD; a semiconductor layer overlying the dielectric; a second set of transistors overlying the semiconductor layer; a capacitor embedded within the dielectric; and a first contact extending through the semiconductor layer and the dielectric to contact one layer of the capacitor, and a second contact extending through the semiconductor layer and the dielectric to contact a second, distinct layer of the capacitor.

10 Claims, 8 Drawing Sheets

(56) References Cited

U.S. PATENT DOCUMENTS

| | | | |
|---|---|---|---|
| 8,258,037 B2* | 9/2012 | Chakravarti | B82Y 10/00 |
| | | | 257/532 |
| 8,492,869 B2 | 7/2013 | Farooq et al. | |
| 8,492,886 B2 | 7/2013 | Or-Bach et al. | |
| 9,673,708 B2* | 6/2017 | Hwang | H02M 3/158 |
| 2015/0091187 A1 | 4/2015 | Reber et al. | |

* cited by examiner

EMBEDDED METAL-INSULATOR-METAL (MIM) DECOUPLING CAPACITOR IN MONOLITIC THREE-DIMENSIONAL (3D) INTEGRATED CIRCUIT (IC) STRUCTURE

BACKGROUND

The subject matter disclosed herein relates to integrated circuit devices. More particularly, the subject matter relates to capacitor structures in three-dimensional (3D) integrated circuit (IC) structures.

Monolithic 3D structures are built with multiple transistors stacked on top of one another, in what is sometimes referred to as a sequential fabrication process. These structures include fabricated connections which are significantly smaller than the through-silicon vias (TSVs) used to vertically connect transistors in conventional IC structures. However, due to minimal spacing between circuit components in these monolithic 3D structures, controlling manufacturing yield and limiting undesirable boundary effects can create design challenges.

SUMMARY

Various embodiments include three-dimensional (3D) integrated circuit (IC) structures and methods of forming such structures. In a first aspect of the disclosure, a 3D IC structure includes: a substrate; a first set of transistors overlying the substrate; a first inter-level dielectric (ILD) overlying the first set of transistors and the substrate; a dielectric overlying the first ILD; a semiconductor layer overlying the dielectric; a second set of transistors overlying the semiconductor layer; a capacitor embedded within the dielectric; and a first contact extending through the semiconductor layer and the dielectric to contact one layer of the capacitor, and a second contact extending through the semiconductor layer and the dielectric to contact a second, distinct layer of the capacitor.

A second aspect of the disclosure includes a three-dimensional (3D) integrated circuit (IC) structure having: a substrate; a first set of transistors overlying the substrate; a first inter-level dielectric (ILD) overlying the first set of transistors and the substrate; a dielectric overlying the first ILD; a semiconductor layer overlying the dielectric; a second set of transistors overlying the semiconductor layer; a metal-insulator-metal (MIM) capacitor embedded within the dielectric; a first contact extending through the semiconductor layer and the dielectric to contact one layer of the capacitor, and a second contact extending through the semiconductor layer and the dielectric to contact a second, distinct layer of the capacitor; and a set of contacts extending between the first set of transistors and the second set of transistors.

A third aspect of the disclosure includes a method of forming a three-dimensional (3D) integrated circuit (IC) structure, the method including: forming a metal-insulator-metal (MIM) capacitor over a first wafer structure, the first wafer structure having: a substrate; a first set of transistors overlying the substrate; a first inter-level dielectric (ILD) overlying the first set of transistors and the substrate; and a dielectric overlying the first ILD; passivating over the MIM capacitor and the dielectric to embed the MIM capacitor within the dielectric; forming a second wafer structure over the dielectric including the embedded MIM capacitor; and forming a first contact extending through the semiconductor layer and the dielectric to contact one layer of the MIM capacitor, and forming a second contact extending through the semiconductor layer and the dielectric to contact a second, distinct layer of the MIM capacitor.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuits (ICs). More particularly, the subject matter relates to a monolithic three-dimensional (3D) IC structure with an embedded metal-insulator-metal (MIM) capacitor, and methods of forming such structures.

In the following description, reference is made to the accompanying drawings that form a part thereof, and in which specific embodiments are shown by way of illustration. These embodiments are described in sufficient detail to enable those skilled in the art to practice the present teachings and it is to be understood that other embodiments may be utilized and that changes may be made without departing from the scope of the present teachings. The following description is, therefore, merely illustrative.

As described herein, "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), molecular layer deposition, evaporation.

The monolithic 3D structure according to various embodiments includes an embedded metal-insulator-metal (MIM) decoupling capacitor. The MIM capacitor requires less silicon area than other capacitors, and given the space constraints in monolithic 3D structures, can be located closer to other circuitry when compared with other capacitors.

Figure 1:
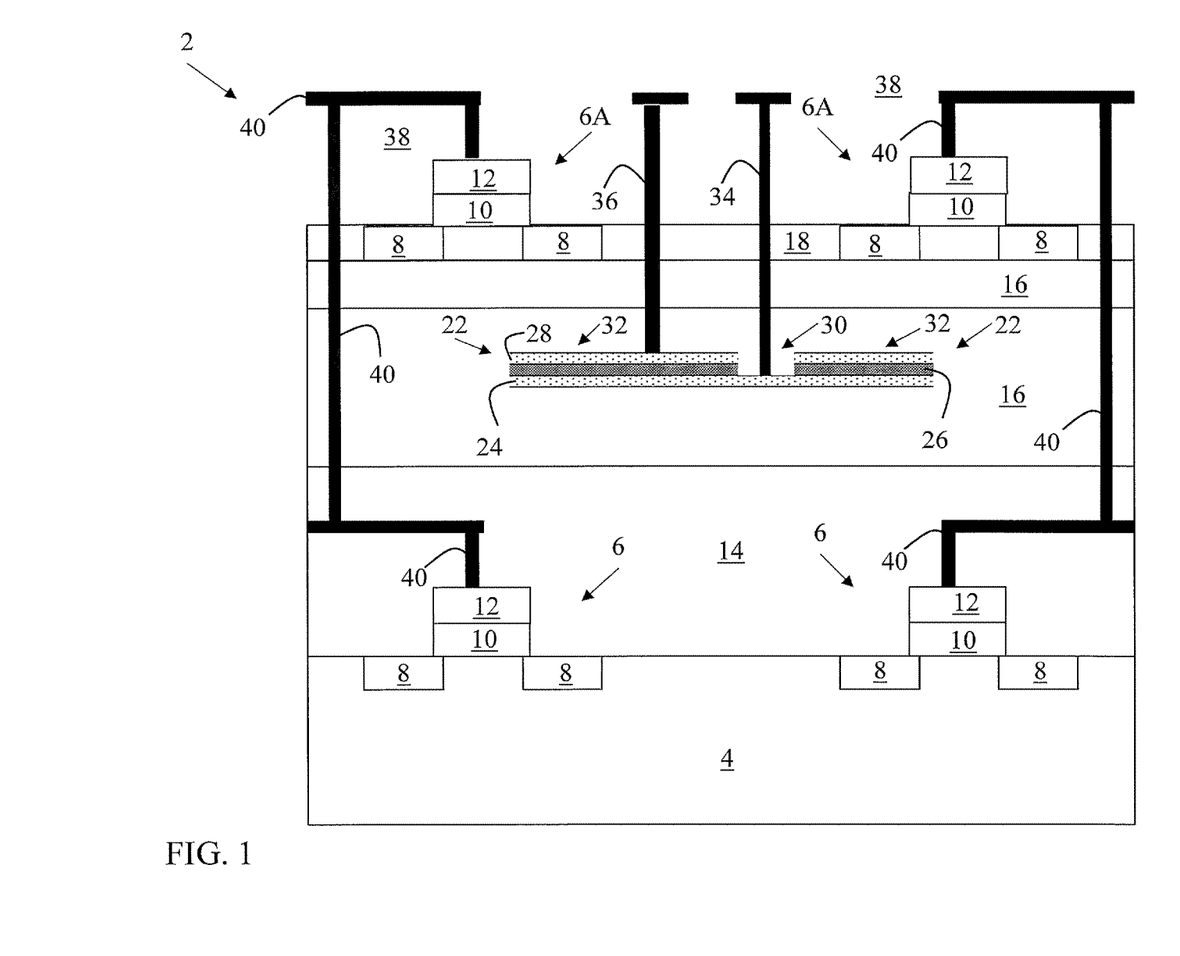
FIG. 1 shows a schematic cross-sectional view of a three-dimensional (3D) integrated circuit (IC) structure according to various embodiments of the disclosure.

FIG. 1 shows a schematic cross-sectional view of a three-dimensional (3D) integrated circuit (IC) structure 2 according to various embodiments of the disclosure. As shown, 3D IC structure 2 can include a substrate 4, which may be formed at least partially of silicon (Si), but in some embodiments, may include silicon dioxide or other silicon-based substrate materials. Overlying substrate (e.g., silicon) 4 is a first set (one or more) of transistors 6 (individually labeled as transistors 6, but including at least one transistor). Transistor(s) 6 can include any conventional transistor structure known in the art, and can include a source/drain regions 8, a gate 10 connecting the source/drain regions 8 and a contact region 12 contacting gate 10. As is known in the art, source/drain regions 8 can be formed within substrate 4, and additional insulator layers and doped regions may be formed as part of transistor(s) 6. Over transistor(s) 6 and substrate 4 is a first inter-level (or inter-layer) dielectric (ILD) 14, which can include a low-k dielectric material, as is known in the art. Example ILD materials can include silicon dioxide (e.g., doped or undoped), organic polymeric dielectrics (e.g., polyimide, polynorbornenes, benzocyclobutene, and PTFE), and/or spin-on polymeric dielectrics (e.g., hydrogen silsesquioxane (HSQ) and methylsilsesquioxane (MSQ)).

Overlying first ILD 14 is a dielectric 16, which can include any conventional oxide material such as silicon dioxide, hafnium oxide ($HfO_x$), zinc oxide ($ZnO_x$), aluminum oxide ($Al_2O_3$), etc. As described herein, dielectric 16 may include a plurality of dielectric layers, which may be formed in distinct processes to effectively create 3D IC structure 2. In some cases, at least a portion of dielectric 16 is formed by passivation, e.g., to embed a capacitor within that layer, as described herein. Over dielectric 16 is a semiconductor layer 18, which may be formed of a similar material as substrate 4 (e.g. silicon or other silicon-based materials), or another silicon-based material described herein or known in the art. It is understood that the approach described herein is further applicable to other semiconductor-based circuit layers such as III-V gallium arsenic (GaAs), gallium antimony (GaSb), etc., by wafer bonding or other known technology. Overlying semiconductor layer 18 is a second set of transistors 6A (referred to individually as transistor 6A), which may include conventional transistor structures, e.g., similar to transistors 6 formed over substrate 4. In this case, transistors 6A may include source/drain regions 8 formed within semiconductor layer 18.

In various embodiments, and in contrast to conventional IC structures, 3D IC structure 2 can further include a capacitor 22 embedded within dielectric 16. In various particular embodiments, capacitor 22 can include a metal-insulator-metal (MIM) capacitor. Where capacitor 22 includes an MIM capacitor, it may include a first metal 24, an insulator 26 over first metal 24 and a second metal 28 over insulator 26. Capacitor 22 can be completely surrounded by dielectric (e.g., oxide) 16 in various embodiments. In various embodiments, capacitor 22 includes a gap 30 between segments 32 of insulator 26 and second metal 28, such that first metal 24 can be accessed from above semiconductor layer 18 through dielectric 16, without going through insulator 26 or second metal 28. Further, 3D IC structure 2 can include a first contact 34 extending through semiconductor layer 18 and dielectric 16 to contact one layer of capacitor 22, e.g., in some cases, first metal 24. 3D IC structure 2 can also include a second contact 36 extending through semiconductor layer 18 and dielectric 16 to contact a second, distinct layer of capacitor 22, e.g., in some cases, second metal 28. According to various embodiments, first contact 34 (contacting first metal 24) includes a low capacitance contact, and second contact 36 (contacting second metal 28) includes a high capacitance contact. In various embodiments, 3D IC structure 2 can also include a second ILD 38 overlying second set of transistors 6A and semiconductor layer 18. Second ILD 38 may include materials similar to ILD 14 and/or other conventional ILD materials. In some cases, first contact 34 and second contact 36 extend into second ILD 38. In various embodiments the embedded capacitor 22 is capable of being accessed from second ILD 38, e.g., at the same layer as transistor 6A, with a tuned process flow. The embedded capacitor 22, without competing with other device layers, is able to function beneficially within dielectric layer 16.

According to various embodiments, 3D IC structure 2 can further include a set of contacts 40 extending between first set of transistors 6 and second set of transistors 6A. In some cases, contacts 40 include at least one contact 40 with a cross-sectional diameter in the range of approximately 20 nanometers (nm) to approximately 300 nm, e.g., from 40 nm to 150 nm. In some cases, the set of contacts 40 extend through second ILD 38, semiconductor layer 18, dielectric (e.g., oxide) 16 and first ILD 14, e.g., in order to connect first set of transistors 6 and second set of transistors 6A.

Figure 2:
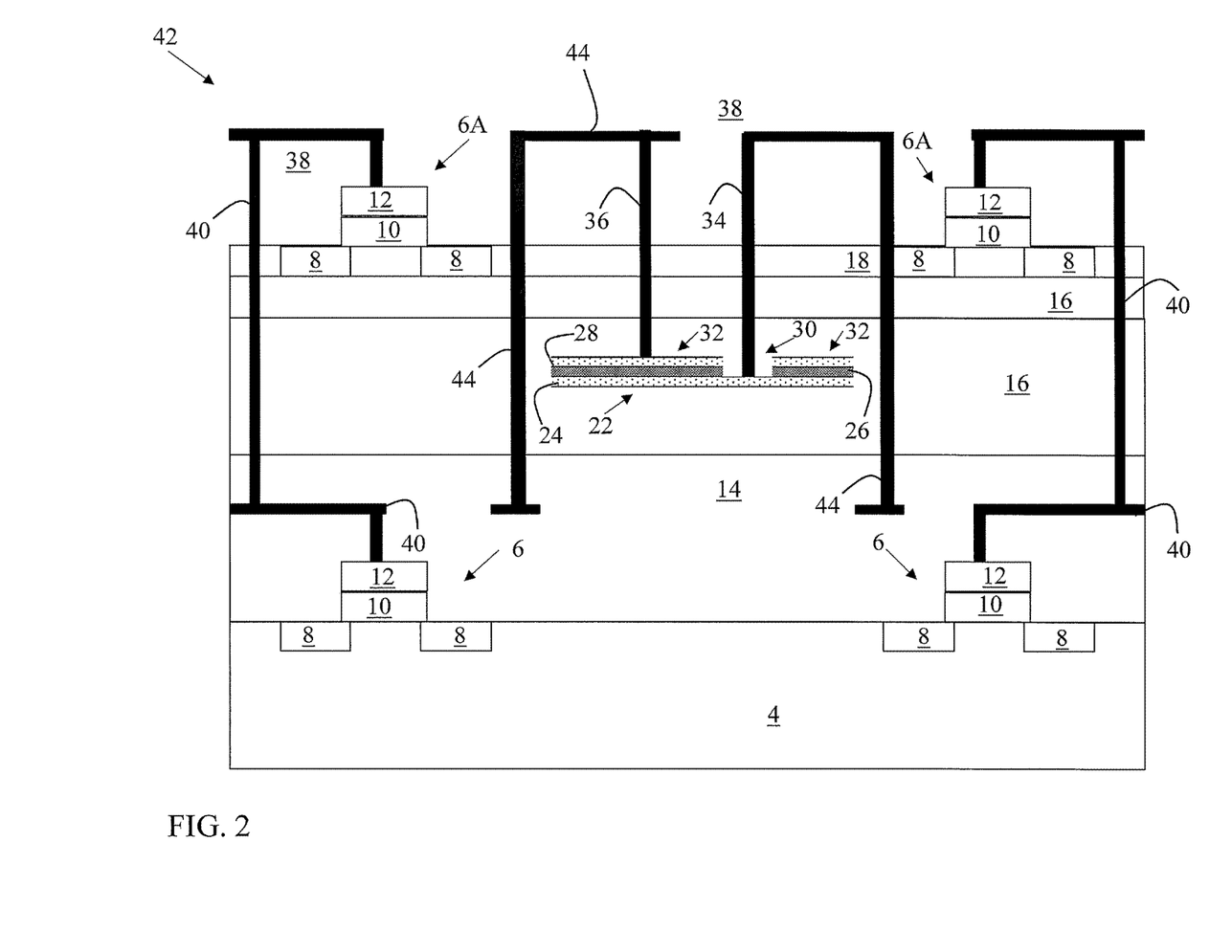
FIG. 2 shows a schematic cross-sectional view of a three-dimensional (3D) integrated circuit (IC) structure according to additional embodiments of the disclosure.

In additional embodiments, as shown in 3D IC structure 42 in FIG. 2, first contact 34 and second contact 36 can include extension contacts 44, which extend back from second ILD 38, through semiconductor layer 18 and dielectric 16, and into first ILD 14. In this embodiment, extension contacts 44 can allow for access (e.g., connection) with capacitor 22 from an area below substrate 4 (e.g., through substrate 4).

Figure 3:
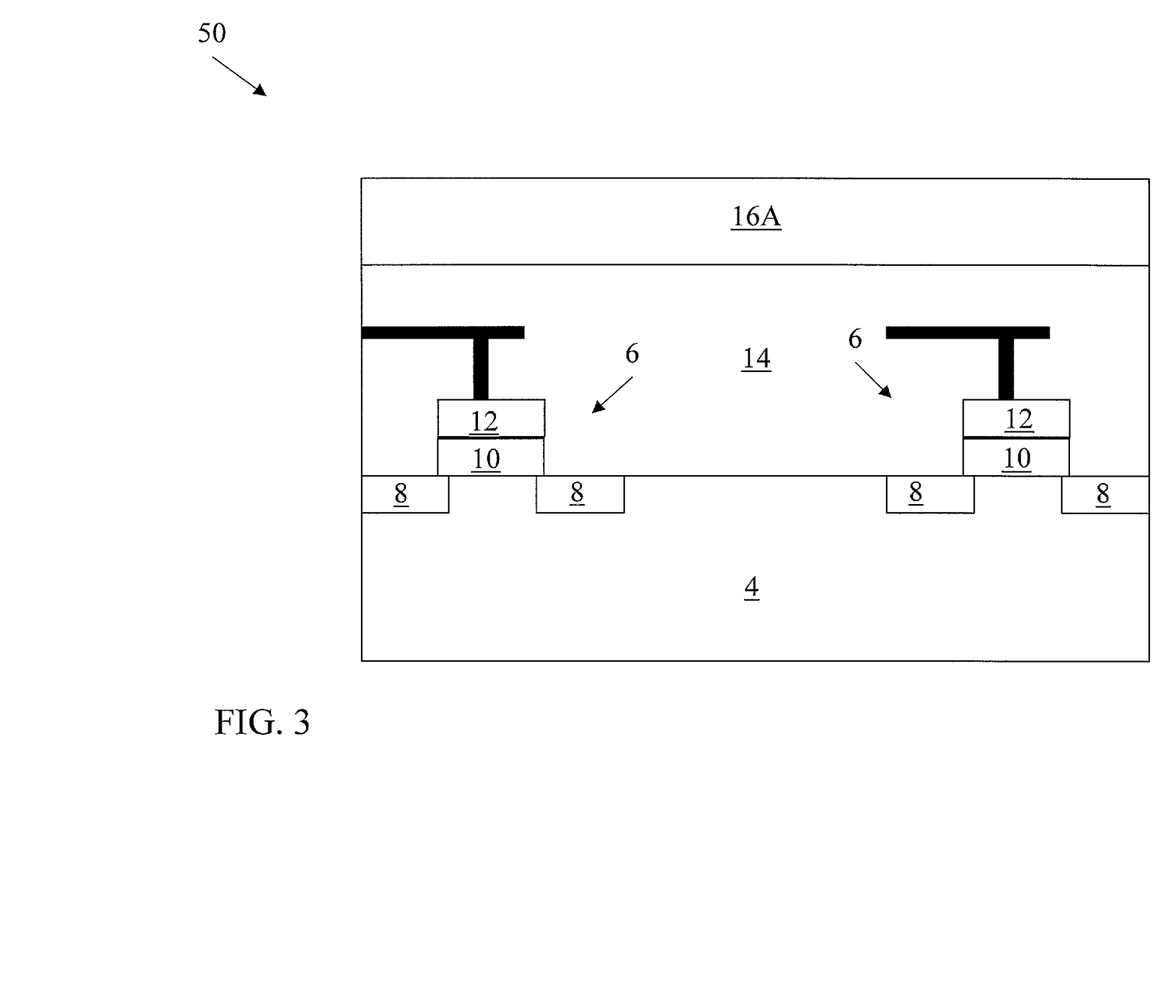
FIG. 3 shows a schematic cross-sectional view of a structure undergoing an additional process in a method according to various embodiments of the disclosure.

FIGS. 3-8 illustrate processes in forming 3D IC structure 2 and 3D IC structure 42, from a first wafer structure 50, according to various embodiments of the disclosure. In particular, FIG. 3 illustrates a first wafer structure 50, which may be formed according to conventional masking, etching, deposition, etc. processes known in the art. First wafer structure 50 can include substrate 4, first set of transistors 6 over substrate 4, first ILD 14 over substrate 4 and over (and surrounding portions of) transistors 6, and dielectric 16A. As shown, dielectric 16A includes a first layer of later-formed dielectric 16, described further herein.

Figure 4:
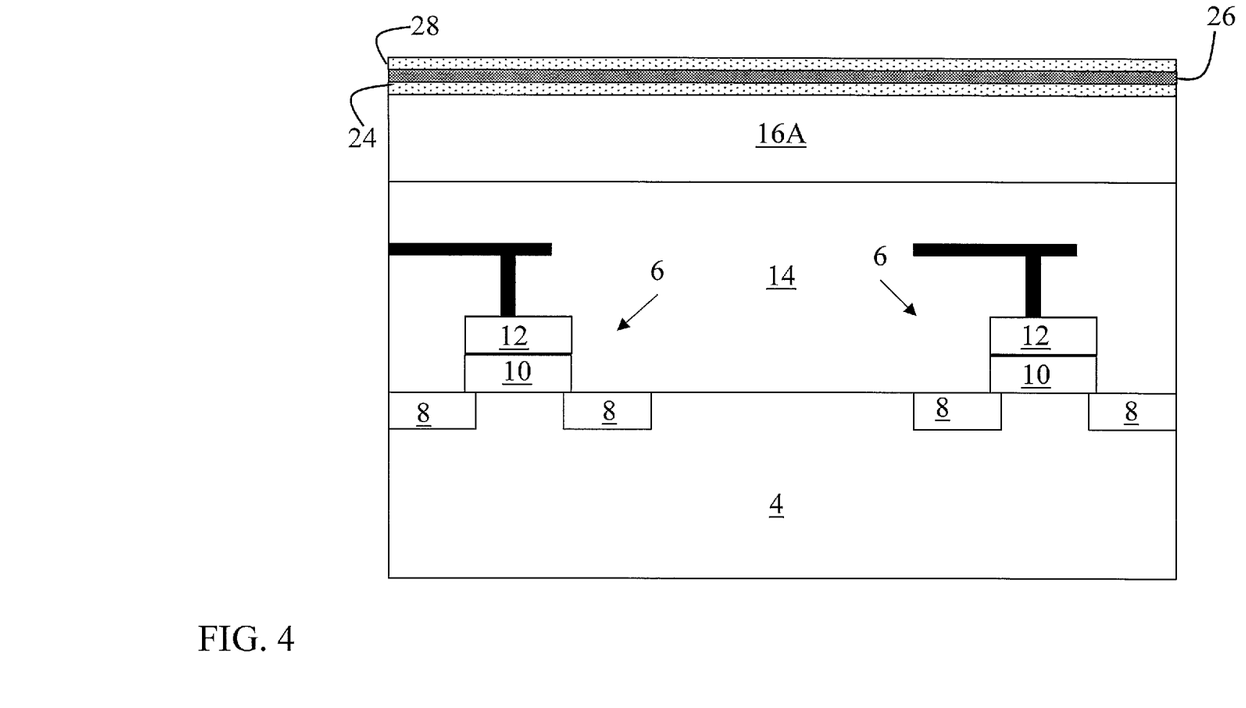
FIG. 4 shows a schematic cross-sectional view of a structure undergoing an additional process in a method according to various embodiments of the disclosure.

FIG. 4 shows a first process in forming a capacitor 22 (FIG. 5), which includes depositing first metal 24 over dielectric 16A, depositing insulator 26 over first metal 24, and depositing second metal 28 over insulator 26. As described herein, first metal 24 and second metal 28 can be formed of any conventional capacitor metal, including, e.g., copper, tungsten, aluminum, tungsten, titanium, nickel, and/or alloys thereof. Insulator 26 can include any conventional capacitor insulator material, including, e.g., silicon dioxide, $HfO_x$, $Al_2O_3$ and/or silicon nitride. First metal 24, insulator 26, and second metal 28 can be deposited by any deposition technique described herein or known in the art.

Figure 5:
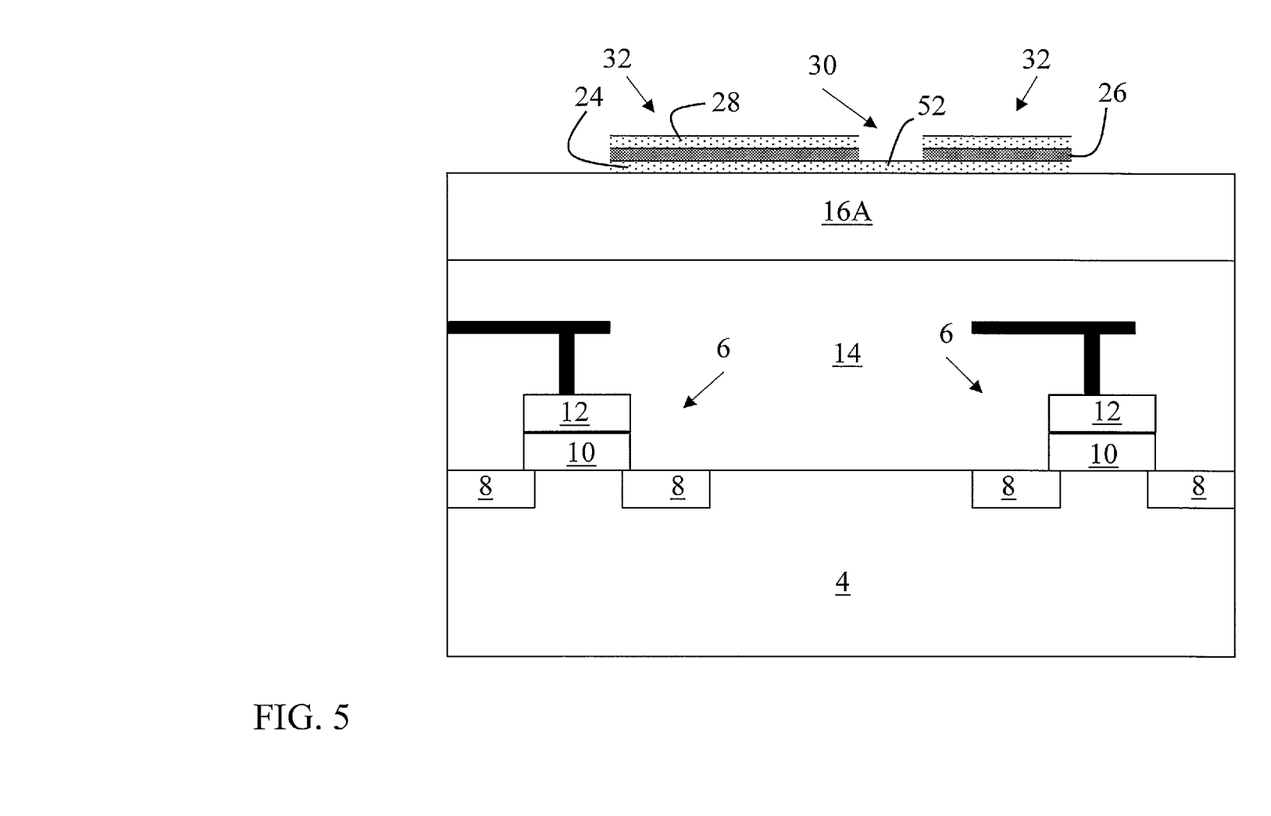
FIG. 5 shows a schematic cross-sectional view of a structure undergoing an additional process in a method according to various embodiments of the disclosure.

FIG. 5 illustrates an additional process of patterning second metal 28 and insulator 26 to expose a portion 52 (of upper surface) of first metal 24. In some cases, patterning can include forming a mask (e.g., photomask) over second metal 28, patterning the mask to form an opening, and etching or otherwise patterning second metal 28 and insulator 26 to form gap 30 between segments 32 of second metal 28 and insulator 26. Etching may include, e.g., dry etching, wet etching and/or reactive ion etching (RIE). In some cases, a multi-step etching process may be used to form gap 30, with selectivity to first metal 24, e.g., a first etch may be used on second metal 28 and a second, distinct etch may be used on insulator 26 to selectively remove insulator 26 without damaging first metal 24.

Figure 6:
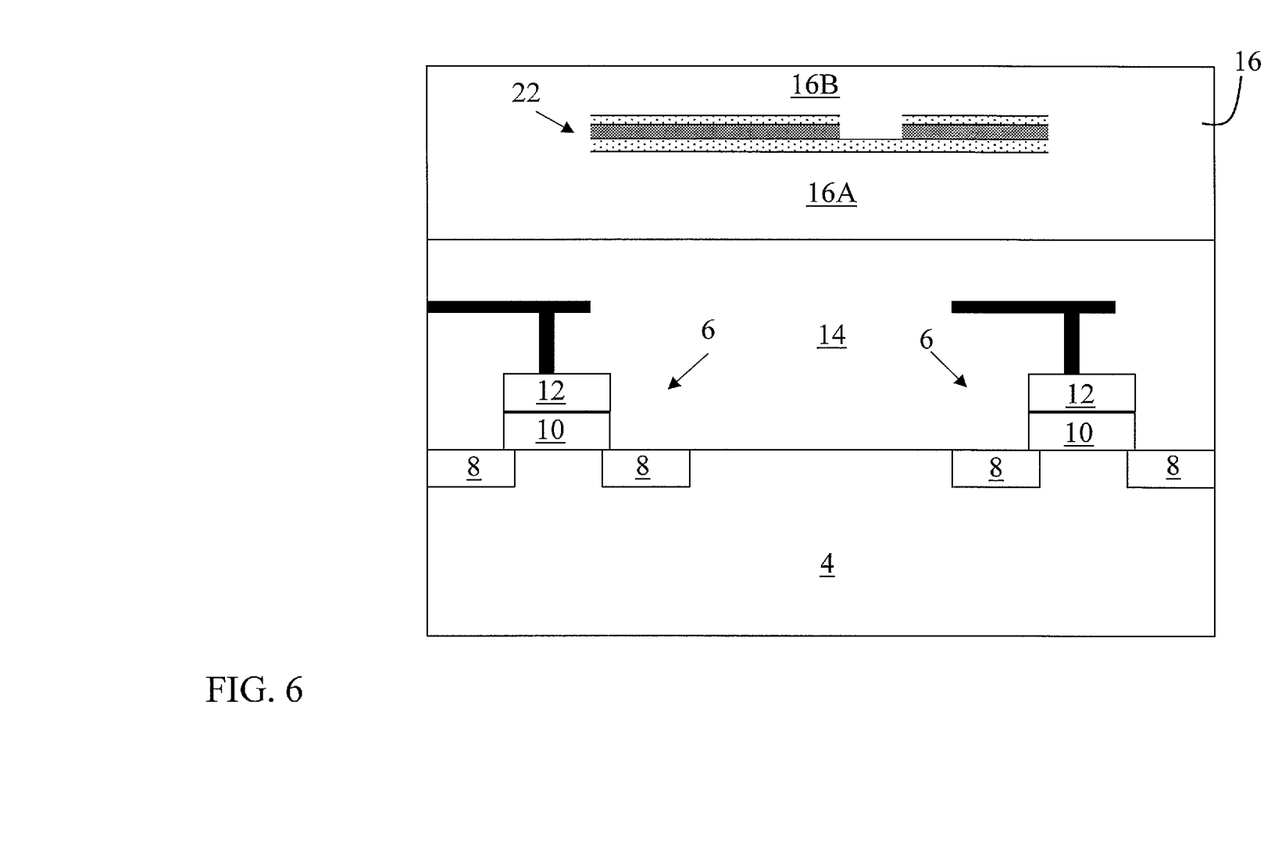
FIG. 6 shows a schematic cross-sectional view of a structure undergoing an additional process in a method according to various embodiments of the disclosure.

FIG. 6 shows an additional process of passivating a dielectric (e.g., oxide) 16B over capacitor 22 and dielectric (e.g., oxide) 16A (forming dielectric 16) to embed capacitor 22 within dielectric 16. This process can include conventional passivation, including, e.g., applying a thin oxide layer over capacitor 22 and placing a portion of dielectric (e.g., oxide) 16 in a passivating bath, e.g., nitric acid-based passivating bath, or a citric acid-based bath. The build-up of dielectric (e.g., oxide) 16B helps to completely cover capacitor 22 with dielectric 16, insulating it from ambient conditions.

Figure 7:
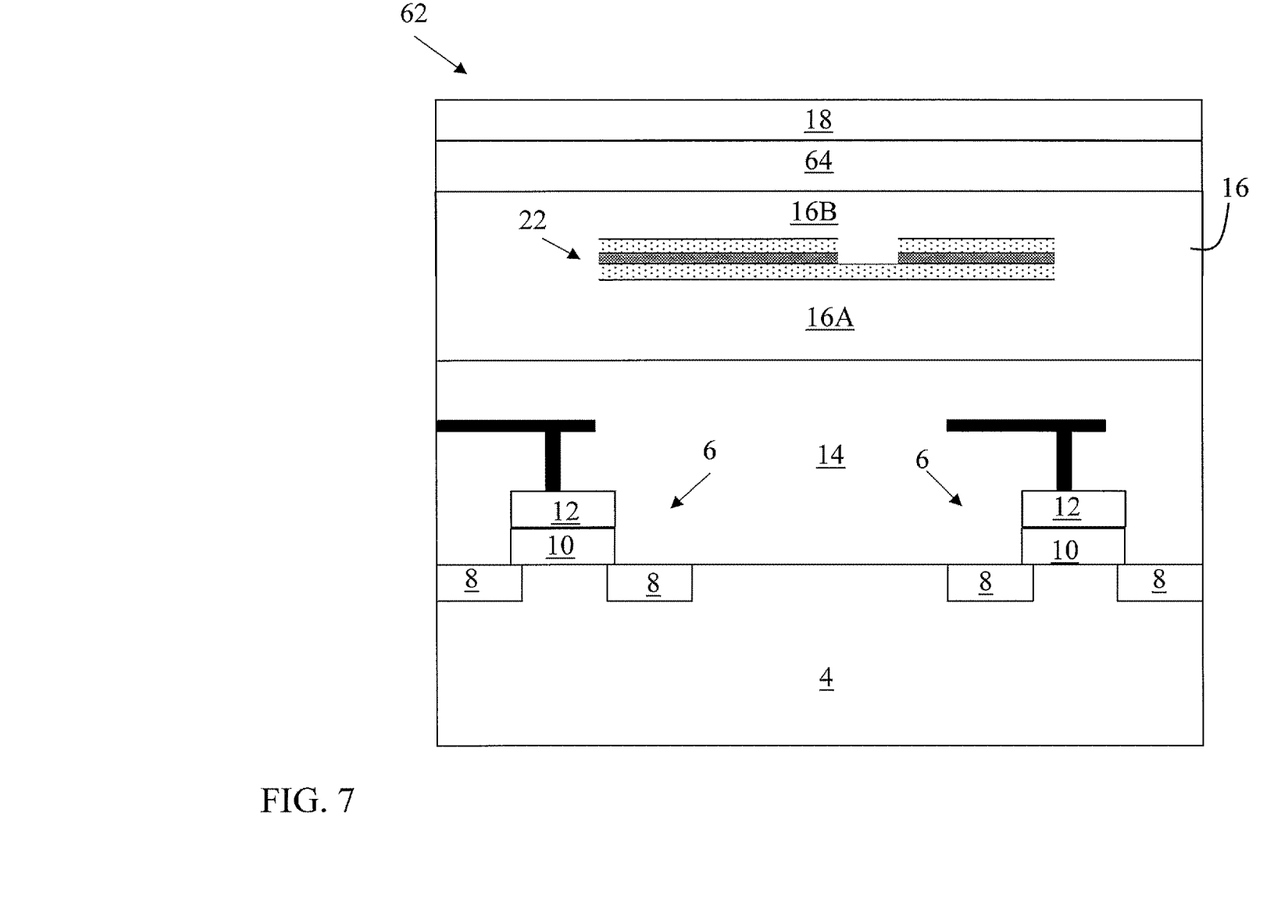
FIG. 7 shows a schematic cross-sectional view of a structure undergoing an additional process in a method according to various embodiments of the disclosure.
Figure 8:
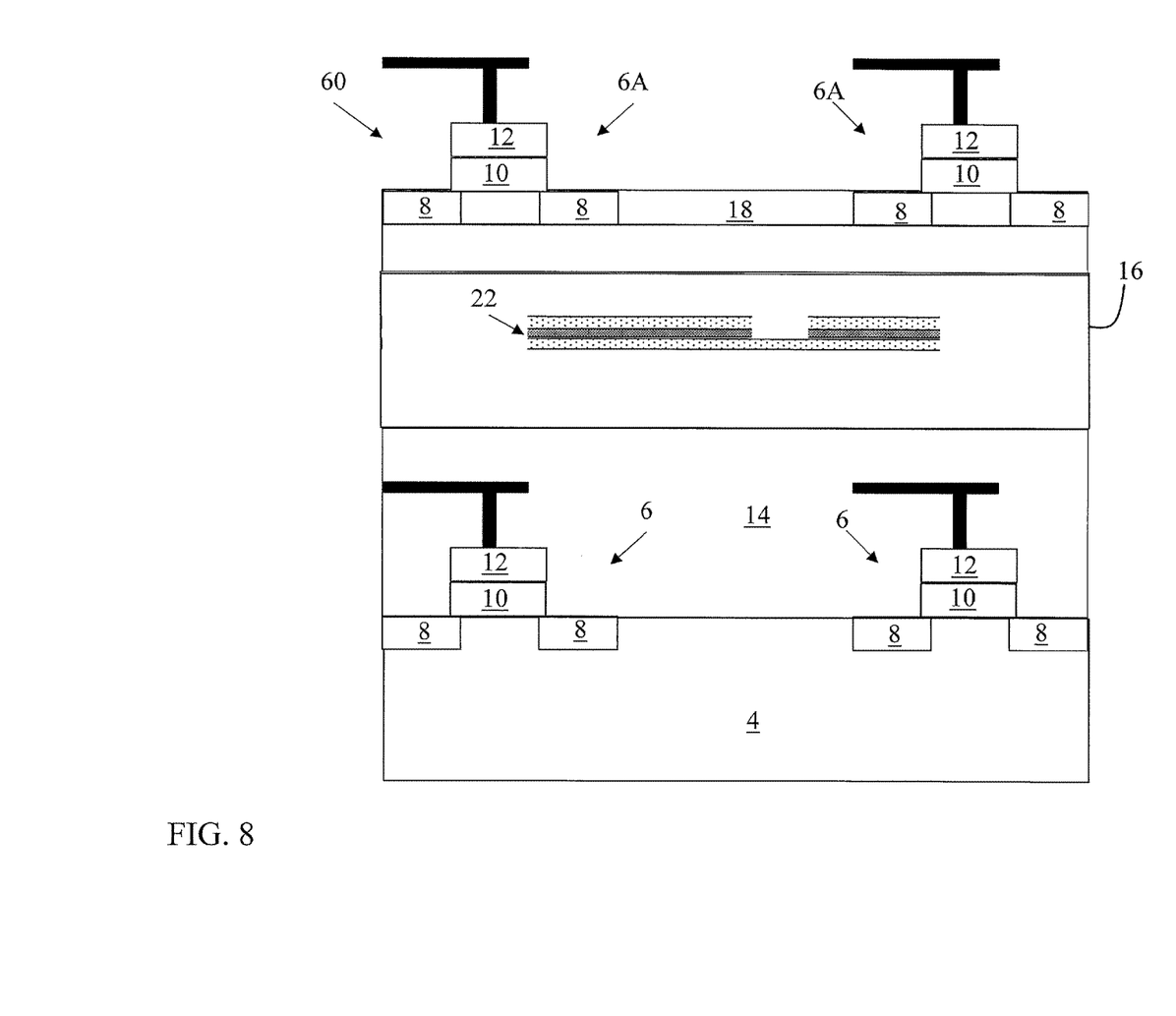
FIG. 8 shows a schematic cross-sectional view of a structure undergoing an additional process in a method according to various embodiments of the disclosure.

FIG. 7 and FIG. 8 show additional processes in forming a second wafer structure 60 (FIG. 8) over dielectric 16. In some cases, as shown in FIG. 7, a silicon-on-insulator (SOI) substrate 62, including a dielectric 64 (e.g., similar to dielectric 16, and including oxide in some cases) and semiconductor layer 18 can be bonded to dielectric 16 according to conventional approaches (dielectric 64 is referred to as part of dielectric 16, hereafter). Following bonding of SOI substrate 62, the process may further include forming second set of transistors 6A, along with second ILD 38 according to conventional masking, etching and deposition techniques.

Returning to FIG. 1, following the process shown in FIG. 8, first contact and second contact are formed, e.g., via masking, patterning, etching, deposition, etc. to contact first metal 24 and second metal 28 of capacitor 22. In various embodiments, selective etching techniques are used to etch through semiconductor layer 18 and dielectric 16, and form through layer vias (TLVs). Lithography and patterning processes along with etching processes, e.g., reactive ion etching, may be performed to form set of contacts 40 through second ILD 38, semiconductor layer 18, dielectric 16 and first ILD 14, e.g., in order to connect first set of transistors 6 and second set of transistors 6A. FIG. 2 shows additional processes of forming extension contacts 44 back through semiconductor layer 18 and dielectric 16.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A three-dimensional (3D) integrated circuit (IC) structure comprising:
   a substrate;
   a first set of transistors overlying the substrate;
   a first inter-level dielectric (ILD) overlying the first set of transistors and the substrate;
   a dielectric overlying the first ILD;
   a semiconductor layer overlying the dielectric;
   a second set of transistors overlying the semiconductor layer;
   a metal-insulator-metal (MIM) capacitor embedded within the dielectric, the MIM capacitor including a first metal, an insulator over the first metal and a second metal over the insulator, the insulator and the second metal including a gap therein; and
   a first contact extending through the semiconductor layer and the dielectric and passing through the gap to contact the first metal of the MIM capacitor, and a second contact extending through the semiconductor layer and the dielectric to contact the second metal of the MIM capacitor.

2. The 3D IC structure of claim 1, wherein the first contact directly contacts the first metal and the second contact directly contacts the second metal.

3. The 3D IC structure of claim 2, wherein the first contact includes a low capacitance contact and the second contact includes a high capacitance contact.

4. The 3D IC structure of claim 1, further comprising a set of contacts extending between the first set of transistors and the second set of transistors.

5. The 3D IC structure of claim 4, wherein the set of contacts includes at least one contact with a cross-sectional diameter of approximately 20 nanometers (nm) to approximately 300 nm.

6. The 3D IC structure of claim 1, further comprising a second ILD overlying the second set of transistors.

7. The 3D IC structure of claim 6, wherein the first contact and the second contact extend into the second ILD.

8. The 3D IC structure of claim 6, wherein the set of contacts extend through the second ILD, the semiconductor layer, the dielectric and the first ILD.

9. The 3D IC structure of claim 6, wherein the first contact and the second contact each include extension contacts extending back from the second ILD, through the semiconductor layer and the dielectric, and into the first ILD.

10. The 3D IC structure of claim 1, wherein the first contact contacts the first metal of the MIM capacitor from above the semiconductor layer and through the dielectric without extending through the insulator and the second metal.

* * * * *